United States Patent
Fang et al.

(10) Patent No.: US 12,421,594 B1
(45) Date of Patent: Sep. 23, 2025

(54) PULSED VOLTAGE WAVEFORM DELIVERY FOR DEPOSITION

(71) Applicant: Applied Materials, Inc., Santa Clara, CA (US)

(72) Inventors: Peijiao Fang, Santa Clara, CA (US); Chengyu Liu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/792,991

(22) Filed: Aug. 2, 2024

(51) Int. Cl.
| | |
|---|---|
| C23C 14/34 | (2006.01) |
| C23C 14/14 | (2006.01) |
| C23C 14/35 | (2006.01) |
| H01J 37/34 | (2006.01) |
| H01J 37/32 | (2006.01) |

(52) U.S. Cl.
CPC .......... C23C 14/3485 (2013.01); C23C 14/14 (2013.01); C23C 14/35 (2013.01); H01J 37/3467 (2013.01); H01J 37/32715 (2013.01); H01J 2237/2007 (2013.01); H01J 2237/332 (2013.01)

(58) Field of Classification Search
CPC ..... C23C 14/3485; C23C 14/14; C23C 14/35; H01J 37/3467; H01J 37/32715; H01J 2237/2007; H01J 2237/332
USPC ............ 204/298.06, 298.08, 192.12, 192.15, 204/192.17
See application file for complete search history.

(56) References Cited

U.S. PATENT DOCUMENTS

| | | | | |
|---|---|---|---|---|
| 4,963,239 | A | * 10/1990 | Shimamura | H01J 37/32706 204/192.12 |
| 6,051,114 | A | * 4/2000 | Yao | H01J 37/32706 204/192.15 |
| 2005/0196976 | A1 | * 9/2005 | Rueger | H01L 21/02211 257/E21.546 |
| 2010/0009533 | A1 | * 1/2010 | Shaviv | H01L 21/68714 438/653 |
| 2015/0114823 | A1 | * 4/2015 | Lee | C23C 14/042 204/192.12 |

FOREIGN PATENT DOCUMENTS

CN 112708865 * 4/2021

OTHER PUBLICATIONS

Machine Translation CN 112708865 (Year: 2021).*

* cited by examiner

*Primary Examiner* — Rodney G McDonald
(74) *Attorney, Agent, or Firm* — Patterson + Sheridan, LLP (57) ABSTRACT

Embodiments of the disclosure describe a method including sputtering material from a physical vapor deposition (PVD) target disposed within a processing chamber. The sputtered material is filtered by an electrode. Filtering the sputtered material causes a first portion of the sputtered material to pass through apertures formed in the electrode and towards a substrate disposed on a substrate support. The first portion of the sputtered material is deposited on a surface of the substrate. Depositing the first portion of the sputtered material includes delivering a pulsed voltage (PV) waveform to an additional electrode that is disposed within the substrate support. The substrate support is disposed within the processing chamber. The PV waveform is configured to apply a pulsed DC bias to the additional electrode. The application of the pulsed DC bias includes forming an etch-to-deposition ratio greater than or equal to 0.5.

20 Claims, 7 Drawing Sheets

602
Disposing a substrate on a substrate support within a processing chamber, a surface of the substrate includes gaps separated by field regions and the gaps include sidewalls and bottoms

604
Disposing the substrate between a first electrode and a second electrode, the second electrode disposed between the substrate and a physical vapor deposition (PVD) target

606
Sputtering material from the PVD target using a plasma formed within the processing chamber

608
Filtering the sputtered material from the PVD target towards the substrate through apertures of the second electrode

610
Delivering a pulsed voltage (PV) waveform to the first electrode

612
Depositing the sputtered material from the PVD target within the gaps of the surface of the substrate with an etch-to-deposition ratio greater than or equal to 0.5 based on the PV waveform

FIG. 6

PULSED VOLTAGE WAVEFORM DELIVERY FOR DEPOSITION

BACKGROUND

Field

Embodiments of the present disclosure generally relate to methods and apparatus for deposition. More specifically, embodiments of the present disclosure relate to physical vapor deposition (PVD) processes.

Description of the Related Art

Physical vapor deposition (PVD) is one of many substrate processing techniques. PVD is a common technique used for depositing thin films of various metals and metal alloys on a substrate. The thin films are typically deposited within features formed in a surface of the substrate. However, when depositing thin films within high aspect ratio features, the thin films can form steps or overhangs over the high aspect ratio features which can prevent material from being deposited in bottoms of the high aspect ratio features which is undesirable.

Accordingly, there is a need in the art for a method and apparatus that solves the problems described above.

SUMMARY

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

Embodiments of the disclosure describe a method including sputtering material from a physical vapor deposition (PVD) target disposed within a processing chamber. The sputtered material is filtered by an electrode. Filtering the sputtered material causes a first portion of the sputtered material to pass through apertures formed in the electrode and towards a substrate disposed on a substrate support. The first portion of the sputtered material is deposited on a surface of the substrate. Depositing the first portion of the sputtered material includes delivering a pulsed voltage (PV) waveform to an additional electrode that is disposed within the substrate support. The substrate support is disposed within the processing chamber. The PV waveform is configured to apply a pulsed DC bias to the additional electrode. The application of the pulsed DC bias includes forming an etch-to-deposition ratio greater than or equal to 0.5.

Embodiments of the disclosure describe an apparatus including a first electrode disposed within a substrate support. A substrate is disposed on the substrate support within a processing chamber. A second electrode is disposed within the processing chamber between a physical vapor deposition (PVD) target and the substrate. The second electrode has apertures configured to filter material sputtered from the PVD target towards the substrate. A voltage source is configured to deliver a pulsed voltage (PV) waveform to the first electrode. The PV waveform is configured to deposit the sputtered material from the PVD target on the substrate with an etch-to-deposition ratio greater than or equal to 0.5.

Embodiments of the disclosure describe a method including delivering a pulsed voltage (PV) waveform to an electrode that is disposed within a substrate support. The PV waveform is configured to apply a first pulsed DC bias to the electrode. A first DC bias is applied to a physical vapor deposition (PVD) target while applying the first pulsed DC bias to the electrode to form a layer of material from the PVD target on a surface of a substrate disposed on the substrate support. An etch-to-deposition ratio of the material from the PVD target on the surface of the substrate is determined. A second pulsed DC bias is applied, by the PV waveform, to the electrode based on the determined etch-to-deposition ratio. A second DC bias is applied to the PVD target while applying the second pulsed DC bias to the electrode to change the determined etch-to-deposition ratio.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to methods and apparatus for depositing a film by use of a physical vapor deposition (PVD) process. More specifically, embodiments of the present disclosure relate to the delivery of a pulsed voltage (PV) waveform during a PVD process. The PV waveforms provided to a processing region of a PVD chamber are used to control an ion-energy-distribution-function (IEDF) of the ions that interact with a surface of the substrate during processing to control the bottom and sidewall coverage of trenches, vias or other types of features formed in a surface of the substrate.

Processing Chamber Examples

Figure 1:
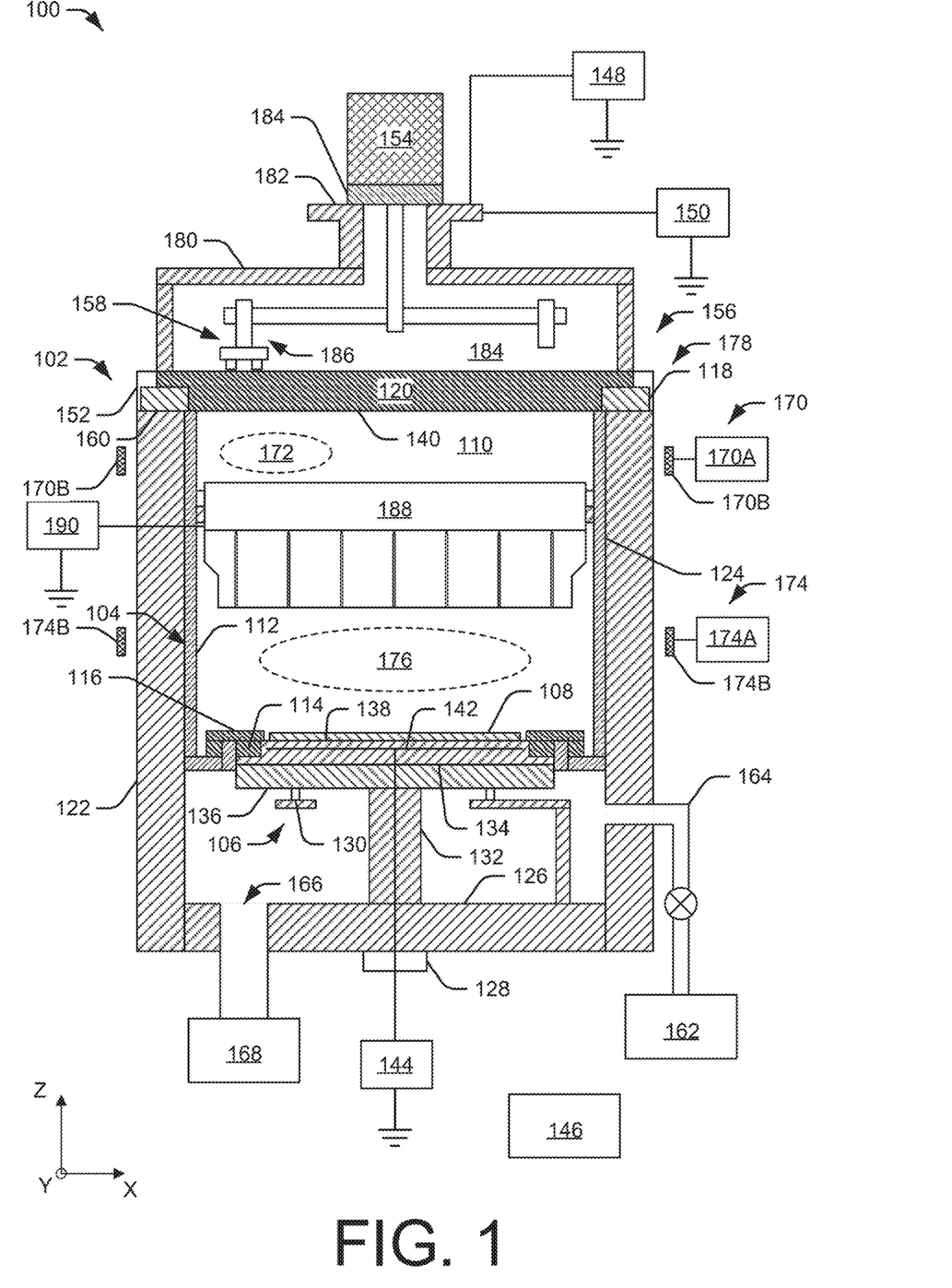
FIG. 1 is a schematic representation of a cross-sectional view of a processing chamber, according to one or more embodiments described herein.

FIG. 1 is a schematic representation of a cross-sectional view of a processing chamber 100, such as a physical vapor deposition (PVD) chamber (e.g., sputtering chamber). The processing chamber 100 includes an upper process assembly 102, a process kit 104, and a pedestal assembly 106, which are all configured to process a substrate 108 disposed in a processing region 110. The process kit 104 includes a one-piece grounded shield 112, a deposition ring 114, a cover ring 116, and an isolator ring assembly 118. In the version shown, the processing chamber 100 comprises a PVD chamber, capable of depositing a single or multi-compositional material from a PVD target 120 on the substrate 108. The processing chamber 100 may also be used to deposit aluminum (Al), copper (Cu), nickel (Ni), platinum (Pt), hafnium (Hf), silver (Ag), chrome (Cr), gold (Au), molybdenum (Mo), silicon (Si), ruthenium (Ru), tantalum (Ta), tantalum nitride (TaN), tantalum carbide (TaC), titanium nitride (TiN), tungsten (W), tungsten nitride (WN), lanthanum (La), alumina (AlOx), lanthanum oxides (LaOx), nickel platinum alloys (NiPt), and titanium (Ti), or combination thereof.

The processing chamber 100 includes a chamber body 122 having sidewalls 124, a bottom wall 126, and the upper process assembly 102 that enclose the processing region 110 or plasma zone. The chamber body 122 is typically fabricated from welded plates of stainless steel or a unitary block of aluminum. In some embodiments, the sidewalls comprise aluminum and the bottom portion of the chamber includes one or more walls that are formed from a stainless steel plate. The sidewalls 124 generally contain a slit valve (not shown) to provide for entry and egress of the substrate 108 from the processing chamber 100. Components in the upper process assembly 102 of the processing chamber 100 in cooperation with the grounded shield 112, pedestal assembly 106 and cover ring 116 confine the plasma formed in the processing region 110 to the region above the substrate 108.

The pedestal assembly 106 is supported from the bottom wall 126 of the processing chamber 100. The pedestal assembly 106 supports the deposition ring 114 along with the substrate 108 during processing. The pedestal assembly 106 is coupled to the bottom wall 126 of the processing chamber 100 by a lift mechanism 128, which is configured to move the pedestal assembly 106 between an upper processing position and lower transfer position. Additionally, in the lower transfer position, lift pins 130 are moved through the pedestal assembly 106 to position the substrate 108 a distance from the pedestal assembly 106 to facilitate the exchange of the substrate 108 with a substrate transfer mechanism disposed exterior to the processing chamber 100, such as a single blade robot (not shown). A bellows 132 is typically disposed between the pedestal assembly 106 and the bottom wall 126 to isolate the processing region 110 from the interior of the pedestal assembly 106 and the exterior of the chamber.

The pedestal assembly 106 generally includes a substrate support 134 sealingly coupled to a platform housing 136. The platform housing 136 is typically fabricated from a metallic material such as stainless steel or aluminum. A cooling plate (not shown) is generally disposed within the platform housing 136 enabling thermal regulation of the substrate support 134.

The substrate support 134 may be comprised of aluminum, stainless steel, and/or ceramic material. The substrate support 134 has a substrate receiving surface 138 that receives and supports the substrate 108 during processing, the substrate receiving surface 138 being substantially parallel to a PVD target surface 140 of the PVD target 120. The substrate support 134 may be an electrostatic chuck, a ceramic body, a heater, or a combination thereof. In some embodiments, the substrate support 134 is an electrostatic chuck that includes a dielectric body having an electrode 142, embedded therein. The dielectric body is typically fabricated from a high thermal conductivity dielectric material such as pyrolytic boron nitride, aluminum nitride, silicon nitride, alumina or an equivalent material. Other aspects of the pedestal assembly 106 and substrate support 134 are further described below. In one embodiment, the electrode 142 is configured so that when a DC voltage is applied to the electrode 142, a substrate 108 disposed on the substrate receiving surface 138 will be electrostatically chucked thereto to improve the heat transfer between the substrate 108 and the substrate support 134. In some embodiments, a pulsed-voltage (PV) waveform source 144 is electrically coupled to the electrode 142, and is configured to generate a pulsed-voltage signal that comprises a PV waveform so that a pulsed voltage signal can be provided to the substrate 108 during processing to affect and control the plasma interaction with the surface of the substrate 108.

A program (or computer instructions) readable by a system controller 146 determines which tasks are performable on a substrate. In some embodiments, the system controller 146 includes a computing device having one or more processors, memory, and storage. The one or more processors can include central processing units, graphics processing units, accelerators, etc. The memory includes main memory for storing instructions for the one or more processors to execute or data for the one or more processors to operate on. For example, the memory includes random access memory (RAM). The storage includes mass storage for data or instructions. As an example and not by way of limitation, the storage may include a removable disk drive, flash memory, an optical disc, a magneto-optical disc, magnetic tape, or a Universal Serial Bus drive or two or more of these. The storage may include removable or fixed media and may be internal or external to the computing device. The storage may include any suitable form of non-volatile, solid-state memory, or read-only memory. The system controller 146 includes a non-transitory computer readable medium or media. The non-transitory computer readable medium or media may include one or more semiconductor-based or other integrated circuits (ICs) (such, as for example, field-programmable gate arrays or application-specific ICs), hard disk drives, hybrid hard drives, optical discs, optical disc drives, magneto-optical discs, magneto-optical drives, solid-state drives, RAM drives, any other suitable non-transitory computer readable storage medium/media, or any suitable combination. The non-transitory computer readable medium or media may be volatile, non-volatile, or a combination of volatile and non-volatile.

Preferably, the program is software readable by the system controller 146 that includes code to perform tasks relating to monitoring, execution, and control of the movement and various process recipe tasks and recipe steps being performed in the processing chamber 100. For example, the program can comprise program code that includes a substrate positioning instruction set to operate the pedestal assembly 106; a gas flow control instruction set to operate gas flow control valves to set a flow of a process gas to the processing chamber 100; a gas pressure control instruction set to operate a throttle valve or gate valve to maintain a pressure in the processing chamber 100; a temperature control instruction set to control a temperature control system (not shown) in the pedestal assembly 106 or sidewalls 124 to set temperatures of the substrate 108 or sidewalls 124, respectively; and a process monitoring instruction set to monitor the process in the processing chamber 100.

The upper process assembly 102 may also comprise an alternating current (AC) source 148, a direct current (DC) source 150, an adaptor 152, a motor 154, and a lid assembly 156. The lid assembly 156 generally comprises the PVD target 120, and a magnetron system 158. The upper process assembly 102 is supported by the sidewalls 124 when in a closed position, as shown in FIG. 1. A ceramic target isolator 160 is disposed between the isolator ring assembly 118, the PVD target 120, and the adaptor 152 of the lid assembly 156 to prevent vacuum leakage there between. The adaptor 152 is sealably coupled to the sidewalls 124, and is configured to help with the removal of the upper process assembly 102 and isolator ring assembly 118.

When in the processing position, the PVD target 120 is disposed adjacent to the adaptor 152, and is exposed to the processing region 110 of the processing chamber 100. The PVD target 120 contains material that is deposited on the substrate 108 during a PVD, or PVD, process. The isolator ring assembly 118 is disposed between the PVD target 120 and the shield 112 and the chamber body 122 electrically isolates the PVD target 120 from the shield 112 and chamber body 122.

During processing, the PVD target 120 is biased relative to a grounded region of the processing chamber 100 (e.g., the chamber body 122 and the adaptor 152) by a power source disposed in the AC source 148 and/or the DC source 150. It is believed that by delivering RF energy and/or DC power to the PVD target 120 during a high pressure PVD process, significant process advantages can be achieved over conventional low pressure DC plasma processing techniques when used in conjunction with PVD materials such as titanium, copper, nickel, ruthenium, aluminum, tantalum, molybdenum, tungsten, and other materials. In one embodiment, the AC source 148 comprises an AC power source and an AC match (not shown) that are configured to efficiently deliver energy to the PVD target 120. In some examples, the AC power source is capable of generating currents at a frequency of between about 13.56 MHz and about 228 MHz at powers between about 0.1 and about 5 KW. In one or more examples, a DC power supply included in the DC source 150 is capable of delivering between about 0.1 and about 50 KW of DC power.

During processing, a gas, such as argon, is supplied to the processing region 110 from a gas source 162 via conduits 164. The gas source 162 may comprise an inert gas such as argon, krypton, helium or xenon, which is capable of energetically impinging upon and PVD material from the PVD target 120 and/or surface of the substrate 108 based on a bias applied which may be applied by the PV waveform source 144. The gas source 162 may also include a reactive gas, such as one or more of an oxygen-containing gas or a nitrogen-containing gas, which is capable of reacting with the PVD material to form a layer on a substrate. Spent process gas and byproducts are exhausted from the processing chamber 100 through exhaust ports 166 that receive spent process gas and direct the spent process gas to an exhaust conduit having an adjustable position gate valve (not shown) to control the pressure in the processing region 110 in the processing chamber 100. The exhaust conduit is connected to one or more exhaust pumps 168, such as a cryopump. Typically, the pressure of the process gas in the processing chamber 100 during processing is set to sub-atmospheric levels, such as a vacuum environment, for example, a pressure of about 0.6 mTorr to about 300 mTorr. In some embodiments, the processing pressure is set to about 20 mTorr to about 100 mTorr.

In some embodiments, a first electromagnet assembly 170 comprises a first current source 170A configured to bias a first magnetic coil assembly 170B. The first magnetic coil assembly 170B is positioned near the PVD target 120, configured to modulate a magnetron-controlled plasma 172. A second electromagnet assembly 174 comprises a second current source 174A configured to bias a second magnetic coil assembly 174B. The second magnetic coil assembly 174B is positioned in the central part of the chamber, and configured to modulate a central portion of a plasma 176. The plasma 176 is formed between the substrate 108 and the PVD target 120 from the gas. Ions within the plasma 176 are accelerated toward the PVD target 120 and cause material to become dislodged from the PVD target 120. The dislodged target material is deposited on the substrate 108.

A lid enclosure 178 generally comprises a conductive wall 180, a center feed 182, and shielding (not shown). In this configuration, the conductive wall 180, the center feed 182, the PVD target 120, and a portion of the motor 154 enclose and form a back region 184. The back region 184 is a sealed region disposed on the backside of the PVD target 120 and is generally filled with a flowing liquid during processing to remove the heat generated at the PVD target 120 during processing. In some embodiments, the conductive wall 180 and the center feed 182 are configured to support the motor 154 and magnetron system 158, so that the motor 154 can rotate the magnetron system 158 during processing. In one or more embodiments, the motor 154 is electrically isolated from the RF or DC power delivered from the power supplies by use of a dielectric layer, such as Delrin, G10, or Ardel. The shielding (not shown) may comprise one or more dielectric materials that are positioned to enclose and prevent the RF energy delivered to the PVD target 120 from interfering with and affecting other processing chambers. In some embodiments, the shielding may comprise a Delrin, G10, Ardel or other similar material and/or a thin-grounded sheet metal RF shield.

To provide efficient PVD deposition, a magnetron system 158 is positioned behind the PVD target 120 in the upper process assembly 102 to create a magnetic field in the processing region 110 adjacent the PVD target surface 140 of the PVD target 120, which generates the magnetron-controlled plasma 172. A magnetic field generated by the magnetron system 158 traps electrons and ions to increase the plasma density over one or more regions of the PVD target 120, and to increase target utilization, control deposition uniformity and the PVD rate. In some embodiments, the magnetron system 158 includes a source magnetron assembly (not shown) that comprises an outer pole (not shown) and an inner pole (not shown). The magnetron system 158 is rotated about a central axis of the processing chamber 100 by use of the motor 154. In some embodiments, a "closed loop" magnetron configuration is formed within the magnetron system 158 such that the outer pole (not shown) of the magnetron surrounds the inner pole (not shown) of the magnetron forming a gap between the poles that is a continuous loop. In the closed loop configuration, the magnetic fields that emerge and reenter through a surface of the PVD target form a "closed loop" pattern can be used to confine electrons near the surface of the PVD target in a closed pattern, which is often called a "racetrack" type pattern. A closed loop, as opposed to the open loop, magnetron configuration is able to confine electrons and generate a high density plasma near the PVD target surface 140 of the PVD target 120 to increase the PVD yield. In some other embodiments, an "open loop" magnetron configuration is formed within the magnetron system 158 such that the outer pole of the magnetron surrounds the inner pole of the magnetron forming a gap between the poles that is a continuous loop. In an open loop magnetron configuration, the electrons trapped between the inner and outer poles will migrate, leak out, and escape from the B-fields created at open ends of the magnetron, thus only holding the electrons for a short period of time during the PVD process due to the reduced confinement of the electrons. It has been found that the use of an open loop magnetron configuration can provide significant step coverage improvements and provide an improved material composition uniformity across the substrate surface, when used in conjunction with the RF and DC PVD of multi-compositional targets described herein.

In some embodiments, the processing chamber 100 includes a collimator 188 (e.g., a flux optimizer) having a plurality of apertures configured to filter material from the PVD target 120 though the collimator 188 and towards the substrate 108 in a manner that can control/adjust a number of ions arriving and an angle of arrival of the ions onto portions of the substrate 108. The process of "filtering" the sputtered material will include the plurality of apertures formed in the collimator 188 having a structural configuration that allows a first portion of the sputtered material to pass through the plurality of apertures in a vertical direction (e.g., Z-direction) while blocking a second portion of the sputtered material that has a primarily angular and non-vertical trajectory from making its way through the collimator 188 and reaching the surface of the substrate 108 disposed on the substrate support. In one or more embodiments, a DC voltage source 190 is electrically coupled to the collimator 188 and configured to apply a positive DC bias to the collimator 188 relative to ground. The positive DC bias is configured to attract sputtered metal ions formed in the magnetron-controlled plasma 172. In some embodiments, the positive DC bias is a voltage in a range of 0.1 V to 300 V. In other embodiments, the positive DC bias may be greater than 300 V.

The PV waveform source 144 delivers a PV waveform to the electrode 142 disposed within the substrate support 134 which applies a pulsed DC bias to the electrode 142. In some embodiments, the PV waveform delivered to the electrode 142 has a relatively large bias potential with a duty cycle that is between 0% and 95% or between 0.01% and 95%, such as between 50% and 85%. In certain embodiments, the PV waveform is delivered to the electrode 142 at a duty cycle that is greater than or equal to 50% such as greater than 80%. In one or more embodiments, a frequency of the PV waveform is in a range of about 100 to 500 kHz, such as between 300 and 500 kHz such as about 400 kHz. Compared to a radio frequency (RF) bias, the pulsed DC bias has a relatively narrow IEDF such that the material from the PVD target 120 is deposited in high aspect ratio trenches or vias formed in the surface of the substrate 108 without forming steps/overhangs over the high aspect ratio trenches or vias, as described further below.

In some embodiments, the material from the PVD target 120 is deposited in the high aspect ratio trenches or vias of the substrate 108 in a one-step deposition process. In other embodiments, the material from the PVD target 120 is deposited in the high aspect ratio trenches or vias of the substrate 108 in multiple steps. By controlling the etch-to-deposition ratio of the material from the PVD target 120, the material from the PVD target 120 can be deposited in the high aspect ratio trenches or vias without voids, pinch-off, or damage.

Pulsed-Voltage Waveform Deposition Examples

Figure 2A:
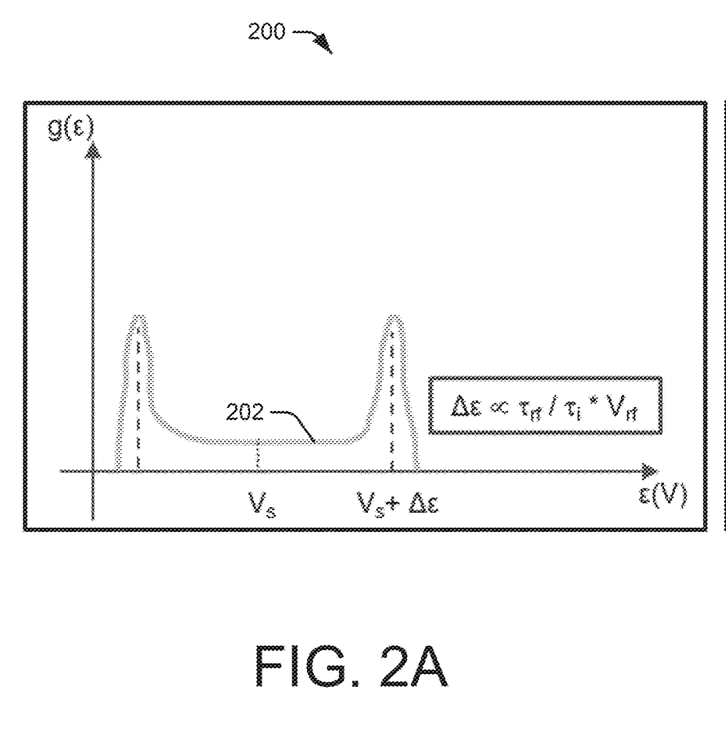
FIGS. 2A and 2B illustrate examples of ion energy distribution functions (IEDFs) based on a radio frequency (RF) bias or based on a pulsed voltage waveform pulsed DC bias, according to one or more embodiments described herein.
Figure 2B:
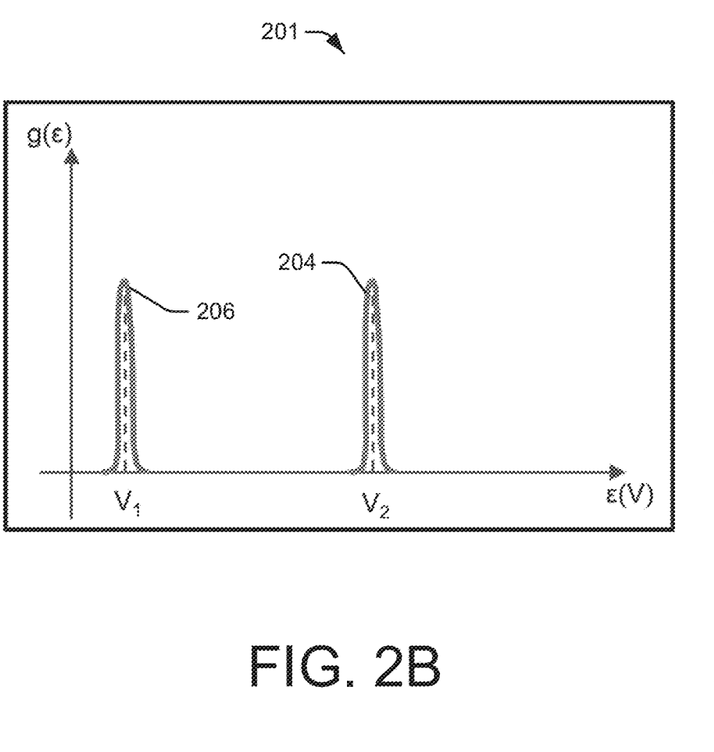
Figure 4A:
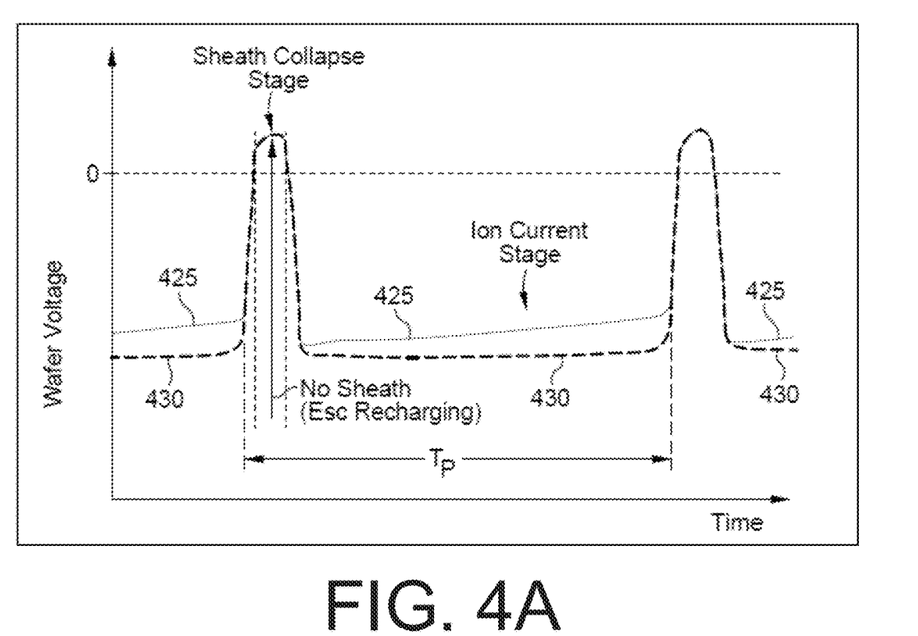
FIG. 4A illustrates a voltage waveform that is established on a substrate due to a voltage waveform applied to an electrode of a processing chamber, according to one or more embodiments described herein.

FIGS. 2A and 2B illustrate examples of ion energy distribution functions (IEDFs) based on a radio frequency (RF) bias 200 or based on the delivery of a pulsed voltage waveform, as for example illustrated in FIG. 4A, that includes a pulsed DC bias 201, respectively, that can be applied to a substrate during processing. The ions that form part of the IEDF will include ionized material from the PVD target 120 that is used to form the film layer on the surface of the substrate 108. The RF bias 200 has a bimodal IEDF 202 with an energy spread depending on an RF voltage ($V_{rf}$) response based on the delivery of a sinusoidal RF signal. Regardless of the level of the RF bias 200, the distribution of the bimodal IEDF 202 causes low energy region ions to have a relatively wide angular distribution after accelerating through the plasma sheath which leads to formation of steps or overhangs over high aspect ratio features such as trenches and vias. Unlike the RF bias 200, the pulsed voltage waveform bias, or pulsed DC bias 201, generates a single narrow IEDF 204 for an applied pulsed voltage waveform bias voltage that is sufficiently high such as $V_2$. A second IEDF 206 may be generated for an applied pulsed voltage waveform bias voltage that is not sufficiently high such as $V_1$. Thus, while an IEDF of the RF bias 200 depends on the $V_{rf}$ response, an IEDF of the pulsed DC bias 201 depends on the applied pulsed voltage waveform bias voltage such as the "on" time voltage $V_1$ or $V_2$ applied during the PV waveform duty cycle. When the pulsed DC bias 201 is increased, for example from $V_1$ to $V_2$, the IEDF 204 rather than the IEDF 206 is created. The increased voltage causes an increased ion energy, which allows for the control and directionality of the flux of ionized target material from the PVD target 120 to the deposited film layer which is used to prevent or minimize the formation of steps or overhangs within high aspect ratio features (e.g., trenches and vias) formed in a surface of the substrate 108.

Figure 3:
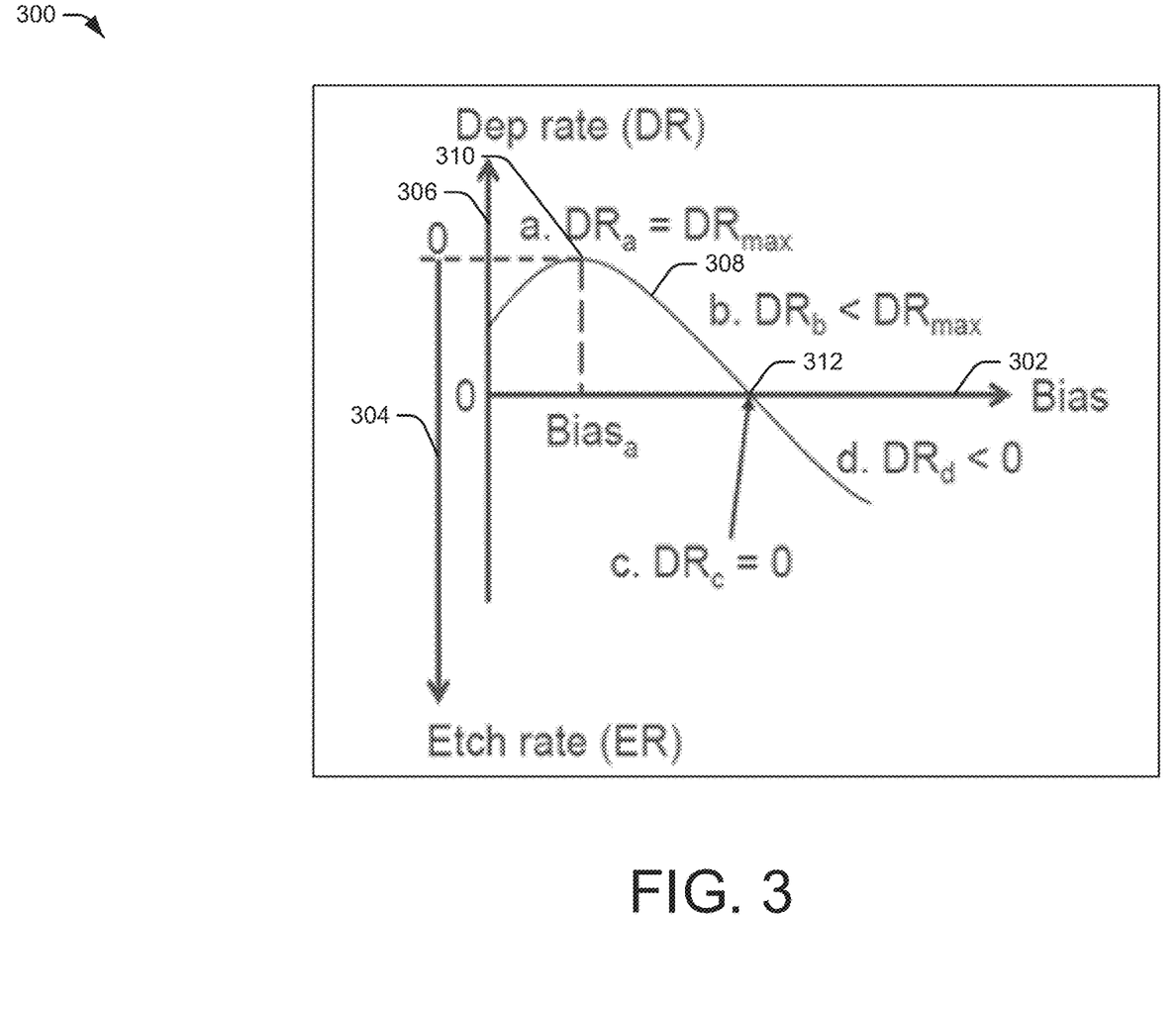
FIG. 3 illustrates a graph of etch and deposition rates, according to one or more embodiments described herein.

FIG. 3 illustrates a graph 300 of etch and deposition rates generated by the application of the pulsed DC bias 201 to a substrate 108. As shown in the graph 300, as bias level, which is illustrated by axis 302, is increased past the maximum deposition rate 310 point, the presence of high energy ions causes removal of a portion of the deposited material due to sputtering, which is referred to herein as an etch rate 304. As the etch rate 304 increases past the maximum deposition rate 310 point a net deposition rate 306 decreases due to the increasing ion energy applied to the substrate 108. However, as shown by the deposition rate 308 curve, at lower pulsed DC biases, the deposition process includes an initial increase in the deposition rate until a maximum deposition rate 310 is reached. Then, as the pulsed DC bias 201 is increased further, the deposition rate will decrease from the maximum deposition rate 310 amount to a zero deposition rate 312, where the amount of material that is deposited is equal to the amount of material that is removed or etched from the surface of the substrate 108. If the pulsed DC bias 201 is then increased further, a net etching region is created where more material is removed from the surface of the substrate 108 than is deposited on the surface of the substrate 108. Between a zero pulsed DC bias 201 (i.e., zero on the bias axis 302) and the zero deposition rate 312 point, the deposition process will include a net deposition of material. In an effort to define or describe the effect of increasing the pulsed DC bias 201 at net deposition rates greater than the maximum deposition rate 310 point and below the zero deposition rate 312 point, an etch-to-deposition ratio is defined as being between 0 and 1. At the zero deposition rate 312, the etch-to-deposition ratio is defined as being equal to 1. For the bias level greater than a bias at the zero deposition rate 312, the etch-to-deposition ratio is defined as being greater than 1. In some examples, a re-PVD ratio and an etching depth ratio may be defined as:

$$RR = \frac{DR_{max}}{DR}$$

$$ED = \frac{ER}{DR_{max}}$$

where: RR represents the re-sputtering ratio; ED represents the etching depth ratio; $DR_{max}$ represents the maximum deposition rate 310; DR represents the deposition rate 306; and ER represents the etch rate 304.

In some embodiments, the etch-to-deposition ratio is tuned to be in a range of about 0.5 to 1.0. For example, the etch-to-deposition ratio in the range of about 0.5 to 1.0 is configured deposit material for a gap-fill process in one deposition step. In one or more embodiments, the etch-to-deposition ratio is tuned to be in a range of about 0.8 to 1.0. In various embodiments, the etch-to-deposition ratio in the range of about 0.8 to 1.0 is configured to deposit between about 1 and 5 nanometers of material and achieve a damage-free gap-fill in high aspect ratio features such as trenches and vias. In some embodiments, the deposited material may include at least one of copper, tungsten, molybdenum, ruthenium, titanium, tantalum, cobalt, or another material.

In some embodiments, in order to maintain the etch-to-deposition ratio in the range of about 0.5 to 1.0 or in the range of about 0.8 to 1.0, the etch-to-deposition ratio for the substrate 108 is measured. The PV waveform delivered to the electrode 142 which applies the pulsed DC bias to the electrode 142 is modified based on the etch-to-deposition ratio for the substrate 108. In some embodiments, if a currently applied pulsed DC bias is greater than a bias at the maximum deposition rate 310 point, then the pulsed DC bias applied to the electrode 142 is increased to increase the etch-to-deposition ratio for the substrate 108 or the pulsed DC bias applied to the electrode 142 is decreased to decrease the etch-to-deposition ratio for the substrate 108. In other embodiments, if the currently applied pulsed DC bias is less than the bias at the maximum deposition rate 310 point, then the pulsed DC bias applied to the electrode 142 is increased (up to the bias at the maximum deposition rate 310 point) to decrease the etch-to-deposition ratio for the substrate 108 or the pulsed DC bias applied to the electrode 142 is decreased to increase the etch-to-deposition ratio for the substrate 108. By controlling the etch-to-deposition ratio for the substrate 108, the material from the PVD target 120 can be deposited in the high aspect ratio trenches or vias without voids, pinch-off, or damage.

FIG. 4A illustrates an example graph 400 of different types of pulsed waveforms 425, 430 established at the surface of the substrate 108 due (i.e., a substrate bias) to different voltage waveforms that are separately established at the electrode 142 within the processing chamber 100 by the PV waveform source 144. The waveforms include two stages: an ion current stage during a first period of time and a sheath collapse stage during a second period of time, as shown. At the beginning of the ion current stage, a drop of substrate voltage creates a high voltage sheath above the substrate 108, accelerating positive ions to the substrate 108. The positive ions that bombard the surface of the substrate 108 during the ion current stage deposit a positive charge on the surface of the substrate 108, which if uncompensated for causes a gradually increase the substrate voltage positively during the ion current stage, as illustrated by voltage waveform 425 in FIG. 4A. However, the uncontrolled accumulation of positive charge on the surface of the substrate 108 undesirably gradually discharges the sheath and chuck capacitors, slowly decreasing the sheath voltage drop and bringing the substrate potential closer to zero, as illustrated by voltage waveform 425. The accumulation of positive charge results in the voltage drop in the voltage waveform established at the surface of the substrate 108 (FIG. 4A). However, a pulsed voltage (PV) waveform that is established at the electrode 142 (e.g., a substrate bias) that has a negative slope during the ion current stage can be generated so as to establish a square shaped region (e.g., near zero slope) for an established substrate voltage waveform, as shown by voltage waveform 430 in FIG. 4A. The first voltage of the PV waveform may be between about negative 100 volts (V) to about negative 2000 V. For example, the first voltage of the PV waveform may be about negative 200 V. For example, the first voltage of the PV waveform may be about negative 600 V. For example, the first voltage of the PV waveform may be about negative 1500 V. Implementing the slope in the waveform established at the electrode 142 during the ion current stage may be referred to as current compensation. The voltage difference between the beginning and end of the ion current phase determines an ion energy distribution function (IEDF) width. The greater the voltage difference, the wider the IEDF width. To achieve mono-energetic ions and a narrower IEDF width, operations are performed to flatten the substrate voltage waveform in the ion current phase using current compensation.

Figure 4B:
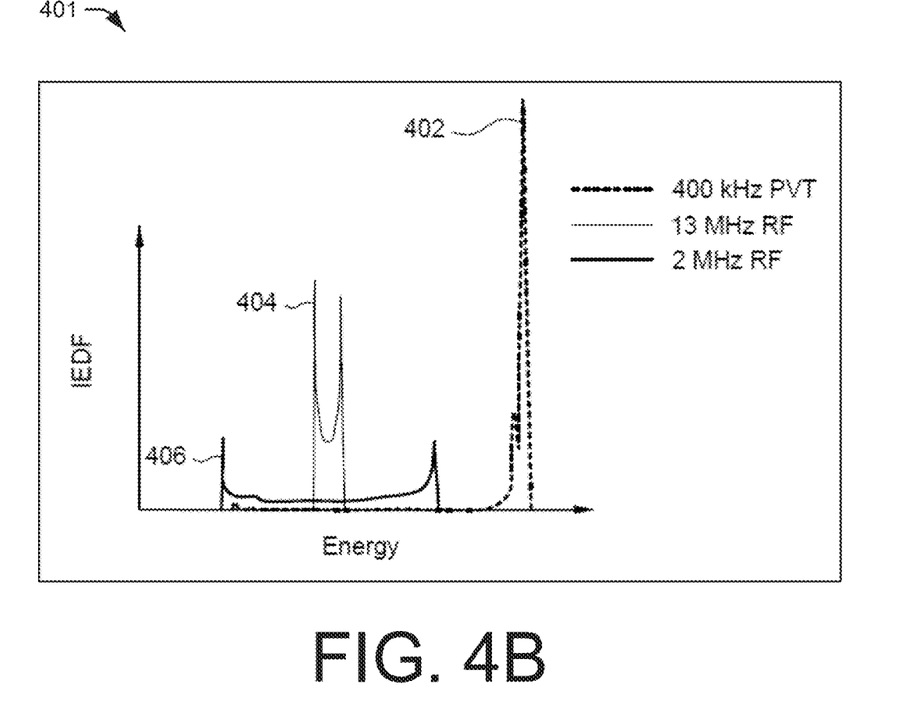
FIG. 4B is a graph illustrating an ion energy distribution function (IEDF), according to one or more embodiments described herein.

FIG. 4B is a graph 401 illustrating an ion energy distribution function (IEDF), in accordance with certain embodiments of the present disclosure. Graph 401 includes a vertical axis plotting the ion population of an IEDF, and a horizontal axis plotting ion energy. Graph 401 depicts an IEDF plot for three different waveforms, a 400 KHz pulsed-voltage (PV) waveform 402, a 13.56 MHz RF waveform 404, and a 2 MHz RF waveform 406.

As shown, the 400 KHz PV waveform 402 exhibits a high magnitude narrow single-peak IEDF. The IEDF of the 400 KHz PV waveform 402 also occurs over a narrow band of ion energies. This is due to the pulsed nature of the 400 KHz PV waveform 402. In comparison to the 400 KHz PV waveform 402, the 13.56 MHz RF waveform 404 exhibits a two-peak (bi-energetic) IEDF. The magnitude of the peaks of the two-peak IEDF for the 13.56 MHz RF waveform 404 are approximately half of the magnitude of the single-peak IEDF of the 400 kHz PV waveform 402. Additionally, the two-peak IEDF for the 13.56 MHz RF waveform 404 occurs over a wider range of ion energies when compared to the 400 KHz PV waveform 402. The two-peak IEDF across a wider range of ion energies is due to the sinusoidal nature of the RF waveform. The 2 MHz RF waveform 406 also exhibits a two-peak (bi-energetic) IEDF. In this instance, the magnitude of the peaks of the two-peak IEDF for the 2 MHz RF waveform 406 are approximately one-fifth the magnitude of the single-peak IEDF of the 400 KHz PV waveform 402. In addition to the lower magnitude, the two-peak IEDF for the 2 MHz RF waveform 406 occurs over a much larger range of ion energies when compared to the 13.56 MHz RF waveform 404 and the 400 KHz PV waveform 402.

The narrow band of ion energies at the high magnitude single-peak exhibited by the 400 KHz PV waveform 402 is preferable over the wider ion energy band and two-peak IEDF exhibited by the 13 MHz RF waveform 404 and the 2 MHz RF waveform 406. The single-peak of the 400 KHz PV waveform 402 offers higher peak power, better control over the power delivered, and improved control over the bombardment angle (e.g., better verticality) when compared to the 13.56 MHz RF waveform 404 and the 2 MHz RF waveform 406. Some embodiments are directed to techniques for implementing the ion energy distribution shown in FIG. 4B using a PV waveform tailoring technique.

Figure 5A:
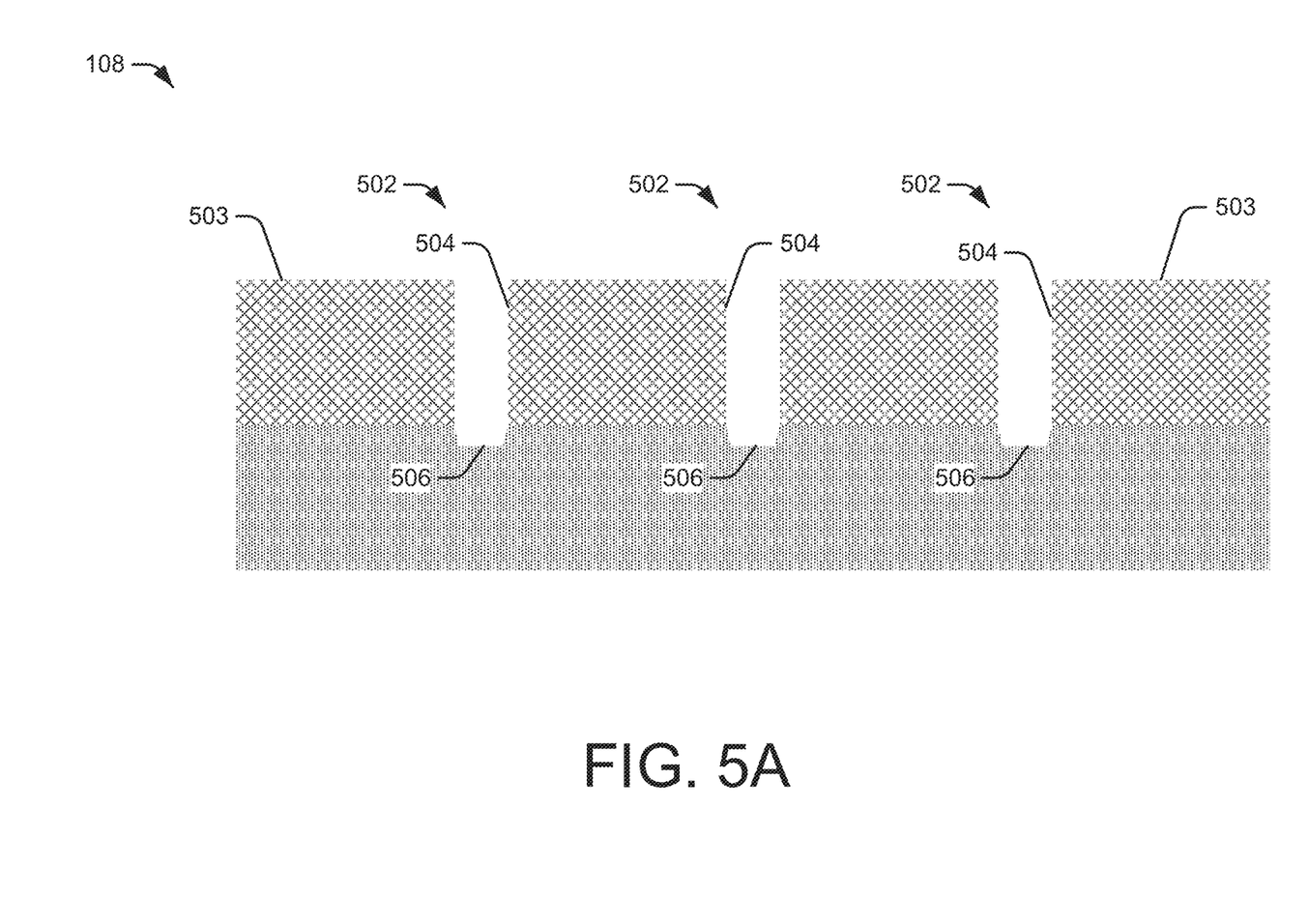
FIG. 5A is a schematic representation of a surface of a substrate before deposition of material from a PVD target, according to one or more embodiments described herein.

FIG. 5A is a schematic representation of a surface of a substrate 108 before deposition of material from a PVD target 120. The surface of the substrate 108 includes gaps 502 (e.g., trenches or vias) and a field region 503 separates the gaps 502. The gaps 502 include sidewalls 504 and bottoms 506.

Figure 6:
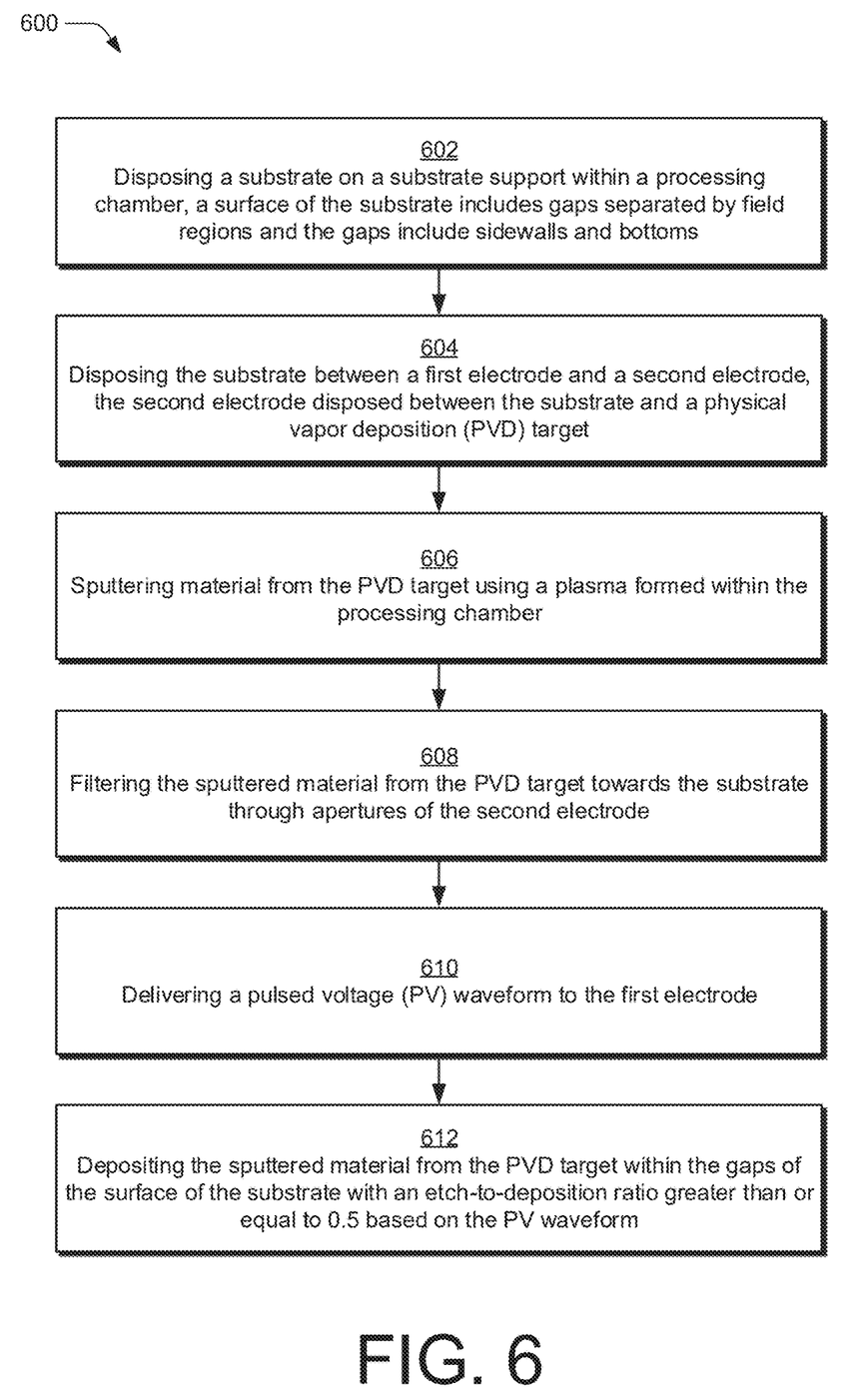
FIG. 6 illustrates a process flow diagram of a method for depositing material on a substrate, according to one or more embodiments described herein.

FIG. 6 illustrates a process flow diagram of a method 600 for depositing material on a substrate 108. At operation 602, a substrate is disposed on a substrate support within a processing chamber, a surface of the substrate includes gaps separated by field regions and the gaps include sidewalls and bottoms. With reference to FIG. 1, the substrate 108 is disposed on the substrate support 134 within the processing region 110 of the processing chamber 100. As described above with respect to FIG. 5A, the surface of the substrate 108 includes gaps 502, and the gaps 502 include sidewalls 504 and bottoms 506. The field region 503 separates the gaps 502 on the surface of the substrate 108.

At operation 604, the substrate is disposed between a first electrode and a second electrode, the second electrode is disposed between the substrate and a physical vapor deposition (PVD) target. Referring to FIG. 1, the substrate 108 is disposed between the electrode 142 and the second electrode which includes the collimator 188. The second electrode (e.g., the collimator 188) is disposed between the substrate 108 and the PVD target 120. In some embodiments, the DC voltage source 190 applies a positive DC bias to the second electrode.

At operation 606, material is sputtered from the PVD target using a plasma formed within the processing chamber. With further reference to FIG. 1, the magnetron-controlled plasma 172 sputters material included in the PVD target 120 within the processing chamber 100. For example, ions within the magnetron-controlled plasma 172 are accelerated toward the PVD target 120 and cause material to become sputtered/dislodged from the PVD target 120. The sputtered material from the PVD target 120 is to be deposited within the gaps 502 of the surface of the substrate 108.

At operation 608, the sputtered material from the PVD target is filtered by the apertures of the second electrode. Referring to FIG. 1, the collimator 188 (e.g., a flux optimizer) of the second electrode includes a plurality of apertures configured to filter the sputtered material from the PVD target 120 though the collimator 188 and towards the substrate 108 in a manner that can control/adjust a number of ions arriving and an angle of arrival of the ions onto portions of the substrate 108. The positive DC bias applied to the second electrode by the DC voltage source 190 is configured to attract sputtered metal ions formed in the magnetron-controlled plasma 172.

At operation 610, a pulsed voltage (PV) waveform is delivered to the first electrode. With reference to FIGS. 1 and 2B, the PV waveform source 144 delivers the PV waveform to the electrode 142 which applies the pulsed DC bias 201 to the electrode 142. As the portion of the sputtered material from the PVD target 120 that is allowed to move towards the substrate 108, the narrow IEDF 204 of the pulsed DC bias 201 causes the sputtered material from the PVD target 120 to be attracted to the surface of the substrate 108 with directionality control.

At operation 612, the sputtered material from the PVD target is deposited within the gaps of the surface of the substrate with an etch-to-deposition ratio greater than or equal to 0.5 based on the PV waveform. With reference to FIGS. 1, 2B, and 3, the PV waveform source 144 delivers the PV waveform to the electrode 142 with a pulsed DC bias 201 that corresponds to a portion of the deposition rate 308 curve between the maximum deposition rate 310 point and the zero deposition rate 312 point. In some embodiments, after initially delivering the PV waveform to the electrode 142, the etch-to-deposition ratio for the sputtered material from the PVD target 120 on the surface of the substrate 108 is determined. After determining the etch-to-deposition ratio for the sputtered material from the PVD target 120 on the surface of the substrate 108, the PV waveform source 144 delivers the PV waveform to the electrode 142 with a pulsed DC bias 201 based on the determined etch-to-deposition ratio. In one example, if the determined etch-to-deposition ratio is, for example, about 0.6, then the PV waveform source 144 can deliver the PV waveform to the electrode 142 with a pulsed DC bias 201 that causes the etch-to-deposition ratio for the sputtered material from the PVD target 120 on the surface of the substrate 108 to be, for example, about 0.8. In another example, if the determined etch-to-deposition ratio is, for example, about 0.9, then the PV waveform source 144 can deliver the PV waveform to the electrode 142 with a pulsed DC bias 201 that causes the etch-to-deposition ratio for the sputtered material from the PVD target 120 on the surface of the substrate 108 to be, for example, about 0.7. In one or more embodiments, it is possible for the PV waveform source 144 to deliver the PV waveform to the electrode 142 such that the pulsed DC bias 201 causes the etch-to-deposition ratio for the sputtered material from the PVD target 120 on the surface of the substrate 108 to be substantially decreased (e.g., at the maximum deposition rate 310 point on the deposition rate 308 curve); however, if a rate of deposition of the sputtered material from the PVD target 120 on the surface of the substrate 108 becomes too high, then steps/overhangs may be formed in relation to high aspect ratio features.

With reference to FIG. 5A, the collimator 188 of the second electrode controls/adjusts the angle of arrival of the ions of the sputtered material from the PVD target 120 onto portions of the substrate 108 such that the angle of arrival is about normal relative to the surface of the substrate 108. As the sputtered material from the PVD target 120 is allowed to pass towards the surface of the substrate 108, the narrow IEDF 204 of the pulsed DC bias 201 causes a relatively thin layer (e.g., 1 to 5 nanometers) of the sputtered material from the PVD target 120 to be deposited on the surface of the substrate 108 and within the gaps 502.

Figure 5B:
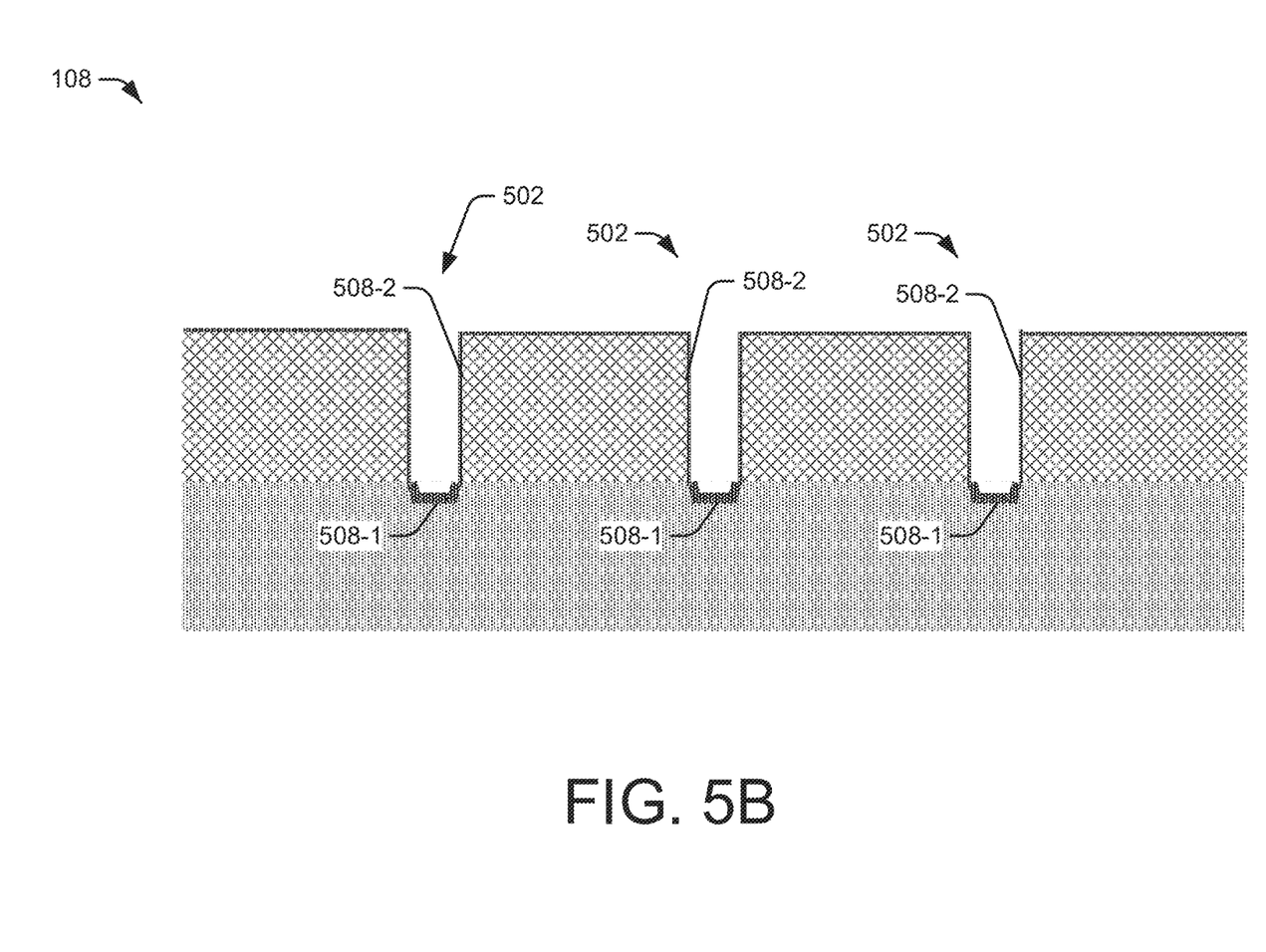
FIG. 5B is a schematic representation of a surface of a substrate after deposition of material from a PVD target, according to one or more embodiments described herein.

FIG. 5B is a schematic representation of a surface of a substrate 108 after deposition of sputtered material from a PVD target 120. As shown, the sputtered material from the PVD target 120 is deposited over the field region 503, the sidewalls 504, and the bottoms 506. Because the PV waveform delivered to the electrode 142 causes the etch-to-deposition ratio to be maintained in the range of about 0.5 to 1.0 or the range of about 0.8 to 1.0, the sputtered material from the PVD target 120 is deposited without voids, pinch-off, or damage. In some embodiments, a first amount 508-1 of the sputtered material from the PVD target 120 is deposited on the bottoms 506 and a second amount 508-2 of the sputtered material from the PVD target 120 is deposited on the sidewalls 504. The first amount 508-1 is greater than the second amount 508-2 because the pulsed DC bias 201 has the narrow IEDF 204. In one or more embodiments, the first amount 508-1 and the second amount 508-2 are deposited in one deposition step (e.g., as part of a one-step deposition process). However, in some embodiments, the first amount 508-1 and the second amount 508-2 can be deposited in multiple deposition steps. By controlling the etch-to-deposition ratio as described above, a thin (e.g., 1 to 5 nanometers) layer of sputtered material from a PVD target can be deposited in trenches or vias of a substrate without damaging the underlying substrate. Additionally, a relatively narrow IEDF associated with a delivered PV waveform prevents the sputtered material from the PVD target from forming steps/overhangs over the trenches or vias.

Additional Considerations

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined, or omitted, and some or all of the steps may be executed in parallel. The steps may be performed actively or passively. The method or process may be repeated or expanded to support multiple components or multiple users within a field environment. Accordingly, the scope should not be considered limited to the specific arrangement of steps shown in a flowchart or diagram.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

As used herein, "a CPU", "controller", "a processor", "at least one processor", or "one or more processors", generally refers to a single processor configured to perform one or multiple operations or multiple processors configured to collectively perform one or more operations. In the case of multiple processors, performance the one or more operations could be divided amongst different processors, though one processor may perform multiple operations, and multiple processors could collectively perform a single operation. Similarly, "a memory", at least one memory", or "one or more memories", generally refers to a single memory configured to store data and/or instructions, multiple memories configured to collectively store data and/or instructions.

As used herein, "gas" and "fluid" may be used interchangeable with either term generally referring to elements, compounds, materials, etc., having the properties of a gas, a fluid, or both a gas and a fluid.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward," "horizontal," "vertical," and the like do not refer to absolute directions. Instead, these terms refer to directions relative to a nonspecific plane of reference. This non-specific plane of reference may be vertical, horizontal, or other angular orientation.

The singular forms "a", "an", and "the", include plural referents, unless the context clearly dictates otherwise. Within a claim, reference to an element in the singular is not intended to mean "one and only one" unless specifically so stated, but rather "one or more". Unless specifically stated otherwise, the term "some" refers to one or more.

Embodiments of the present disclosure may suitably "comprise", "consist", or "consist essentially of", the limiting features disclosed, and may be practiced in the absence of a limiting feature not disclosed. As used here and in the appended claims, the words "comprise", "has", and "include", and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

"Coupled" and "coupling" means that the subsequently described material is connected to previously described material. The connection may be a direct, or indirect connection, and may, or may not, include intermediary components such as plumbing, wiring, fasteners, mechanical power transmission, electrical communication, wired and/or wireless transmission, etc., which may suitable to affect operation of the components.

As used, the term "determining" encompasses a wide variety of actions. For example, "determining" may include calculating, computing, processing, deriving, investigating, looking up, for example, looking up in a table, a database, or another data structure, and ascertaining. In addition, "determining" may include receiving, for example, receiving information, and accessing, for example, accessing data in a memory. In addition, "determining" may include resolving, selecting, choosing, and establishing.

When the word "approximately" or "about" are used, this term may mean that there may be a variance in value of up to +10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112 (f), for any limitations of any of the claims, except for those in which the claim expressly uses the words 'means for' together with an associated function.

The following claims are not intended to be limited to the embodiments provided but rather are to be accorded the full scope consistent with the language of the claims.

What is claimed is:

1. A method comprising:
   sputtering material from a physical vapor deposition (PVD) target disposed within a processing chamber;
   filtering, by use of an electrode, the sputtered material, wherein filtering the sputtered material causes a portion of the sputtered material to pass through apertures formed in the electrode and towards a substrate disposed on a substrate support; and
   depositing the portion of the sputtered material on a surface of the substrate, wherein:
   depositing the portion of the sputtered material comprises delivering an asymmetric pulsed voltage (PV) waveform to an additional electrode that is disposed within the substrate support;
   the substrate support is disposed within the processing chamber;
   the asymmetric PV waveform comprises a first stage and a second stage, the second stage being longer than the first stage;
   the asymmetric PV waveform has a voltage between −100 V and −2000 V during the second stage; and
   the asymmetric PV waveform is configured to apply a pulsed DC bias to the additional electrode to maintain an etch-to-deposition ratio associated with the depositing of the portion of the sputtered material between 0.5 and 1.0.

2. The method of claim 1, wherein the sputtered material includes at least one of copper, tungsten, molybdenum, titanium, cobalt, tantalum, or ruthenium.

3. The method of claim 1, wherein the pulsed DC bias applied to the additional electrode maintains the etch-to-deposition ratio at greater than or equal to 0.8.

4. The method of claim 1, wherein a thickness of the sputtered material deposited on the substrate is in a range of 1 to 5 nanometers.

5. The method of claim 1, further comprising:
   measuring the etch-to-deposition ratio; and
   modifying the asymmetric PV waveform based on the etch-to-deposition ratio.

6. The method of claim 1, wherein the additional electrode includes a chucking electrode.

7. The method of claim 1, wherein the portion of the sputtered material is deposited on the surface of the substrate by a one-step deposition process.

8. The method of claim 1, wherein:
   a frequency of the asymmetric PV waveform is between 100 and 500 kHz; and
   a duty cycle of the asymmetric PV waveform is greater than 50 percent.

9. An apparatus, comprising:
   a first electrode disposed within a substrate support;
   a substrate disposed on the substrate support within a processing chamber;
   a second electrode disposed within the processing chamber between a physical vapor deposition (PVD) target and the substrate, wherein the second electrode having apertures configured to filter sputtered material from the PVD target towards the substrate; and
   a voltage source configured to deliver an asymmetric pulsed voltage (PV) waveform to the first electrode, wherein:
   the asymmetric PV waveform comprises a first stage and a second stage, the second stage being longer than the first stage;
   the asymmetric PV waveform has a voltage between −100 V and −2000 V during the second stage; and
   the asymmetric PV waveform configured to deposit the sputtered material from the PVD target on the substrate with an etch-to-deposition ratio between 0.5 and 1.0.

10. The apparatus of claim 9, wherein a thickness of the sputtered material from the PVD target deposited on the substrate is in a range of 1 to 5 nanometers.

11. The apparatus of claim 10, wherein the sputtered material from the PVD target includes at least one of copper, tungsten, molybdenum, titanium, cobalt, tantalum, or ruthenium.

12. The apparatus of claim 9, wherein the etch-to-deposition ratio is greater than or equal to 0.8.

13. The apparatus of claim 9, wherein the sputtered material from the PVD target is deposited in trenches or vias formed in a surface of the substrate.

14. The apparatus of claim 13, wherein the sputtered material from the PVD target is deposited in the trenches or vias formed in the surface of the substrate by a one-step deposition process.

15. The apparatus of claim 9, wherein:
   a frequency of the asymmetric PV waveform is between 100 and 500 kHz; and
   a duty cycle of the asymmetric PV waveform is greater than 50 percent.

16. A method comprising:
delivering an asymmetric pulsed voltage (PV) waveform to an electrode that is disposed within a substrate support, the PV waveform configured to apply a first pulsed DC bias to the electrode, wherein the asymmetric PV waveform comprises a first stage and a second stage, the second stage being longer than the first stage, and wherein the asymmetric PV waveform has a voltage between −100 V and −2000 V during the second stage;
applying a first DC bias to a physical vapor deposition (PVD) target while applying the first pulsed DC bias to the electrode to form a layer of material from the PVD target on a surface of a substrate disposed on the substrate support;
determining an etch-to-deposition ratio of the material from the PVD target on the surface of the substrate;
applying, by the asymmetric PV waveform, a second pulsed DC bias to the electrode based on the determined etch-to-deposition ratio; and
applying a second DC bias to the PVD target while applying the second pulsed DC bias to the electrode to change the etch-to-deposition ratio such that the etch-to-deposition ratio is between 0.5 and 1.0.

17. The method of claim 16, wherein the determined etch-to-deposition ratio is greater than or equal to 0.8.

18. The method of claim 16, wherein the layer of the material from the PVD target is formed in trenches or vias in the surface of the substrate.

19. The method of claim 18, wherein the layer of the material from the PVD target that is formed in the trenches or the vias has a thickness in a range of 1 to 5 nanometers.

20. The method of claim 16, wherein:
a frequency of the asymmetric PV waveform is between 100 and 500 kHz; and
a duty cycle of the asymmetric PV waveform is greater than 50 percent.

* * * * *